(12) United States Patent
Castoldi et al.

(10) Patent No.: US 6,249,033 B1
(45) Date of Patent: Jun. 19, 2001

(54) CONTROLLED-DRIFT APPARATUS FOR DETECTING ENERGY AND POINT OF INCIDENCE OF ELECTROMAGNETIC RADIATIONS OR IONIZING PARTICLES

(75) Inventors: Andrea Castoldi; Emilio Gatti; Chiara Guazzoni; Antonio Longoni, all of Milan (IT); Pavel Rehak, Setauket, NY (US); Lothar Strüder, Munich (DE)

(73) Assignees: Istituto Nazionale di Fisica Nucleare (IT); Max-Planck-Gesellschaft zur Förderung der Wissenschaften e.V. (DE)

( * ) Notice: Subject to any disclaimer, the term of this patent is extended or adjusted under 35 U.S.C. 154(b) by 0 days.

(21) Appl. No.: 09/032,130

(22) Filed: Feb. 27, 1998

(30) Foreign Application Priority Data

Feb. 27, 1997 (IT) .............................................. MI97A0423

(51) Int. Cl.[7] .......................... H01L 31/115; H01L 31/06; H01L 31/072; H01L 31/109; H01L 31/0328
(52) U.S. Cl. .......................... 257/429; 257/186; 257/461; 257/465
(58) Field of Search ................................... 257/186, 429, 257/461, 462, 465

(56) References Cited

U.S. PATENT DOCUMENTS

| 4,885,620 | 12/1989 | Kemmer et al. ........................ 357/24 |
| 5,283,460 | * 2/1994 | Mita ..................................... 257/432 |
| 5,466,954 | * 11/1995 | Aizpuru et al. ...................... 257/187 |
| 5,889,313 | * 3/1999 | Parker ................................. 257/429 |

FOREIGN PATENT DOCUMENTS 70 46205 * 4/1972 (FR) .

OTHER PUBLICATIONS

Castoldi A., et al.: "Conception and Design Criteria of a Novel Silicon Device for the Measurement of Position and Energy of X Rays", IEEE Transactions on Nuclear Science, vol. 44, No. 5, Oct. 1997, pp. 1724–1732.

(List continued on next page.)

*Primary Examiner*—Eddie C. Lee
*Assistant Examiner*—Allan R. Wilson
(74) *Attorney, Agent, or Firm*—Roberts S. Lipton; Lipton, Weinberger & Husick (57) ABSTRACT

An apparatus for detecting energy and point of incidence of an ionizing event comprising a semiconductor layer with a first type of conductivity, in which at least one first doped region with the first type of conductivity and a corresponding plurality of second doped regions with a second type of conductivity associated to said at least one first doped region are formed on a first surface of said layer, said at least first doped region and said corresponding plurality of second doped regions defining a respective drift path for charge carriers with the first type of conductivity, and at least one third doped region with the second type of conductivity is formed on a second surface of said layer, and means for biasing said second doped regions and said third doped region which is capable of reversely biasing the junctions between the second doped regions and the semiconductor layer and between the third doped region and the semiconductor layer so as to deplete the semiconductor layer. Said biasing means is capable of providing two different operating conditions of the detection apparatus, the first operating condition providing the formation of a plurality of potential energy wells for said charge carriers in the semiconductor layer at predetermined distances along said drift path from said first doped region, said wells being able to confine all of the charge carriers generated by an ionizing event essentially to the points of incidence of the ionizing event, the second operating condition providing the removal of said potential energy wells so as to cause the charge carriers to drift towards said at least one first doped region along said drift path and keeping the charge carriers confined to directions which are perpendicular to the drift path. The electric fields in the apparatus are different, although static in the two different operating conditions.

21 Claims, 8 Drawing Sheets

OTHER PUBLICATIONS

Castoldi A., et al.: "A New Silicon Drift Detector with Reduced Lateral Diffusion", Nuclear Instruments and Methods in Physics Research, vol. 377, No. 2, Aug. 1996, pp. 375–380.

Struder L.: "Recent Developments in Semicondutor Detectors and On–Chip Electronics", Nuclear Instruments and Methods in Physics Research, vol. A 283, No. 3, Nov. 10, 1989, pp. 387–398.

Kemmer, J.: "Advanced Concepts for Semiconductor Nuclear Radiation Detectors", Nuclear Instruments and Methods in Physics Research, vol. B45, No. 1/04, Jan. 2, 1990, pp. 247–251.

* cited by examiner

CONTROLLED-DRIFT APPARATUS FOR DETECTING ENERGY AND POINT OF INCIDENCE OF ELECTROMAGNETIC RADIATIONS OR IONIZING PARTICLES

FIELD OF INVENTION

The present invention relates to a semiconductor apparatus for detecting energy and point of incidence of electromagnetic radiations, particularly but not exclusively X rays, or ionizing particles.

BACKGROUND OF THE INVENTION

The currently known semiconductor apparatuses for detecting energy and point of incidence of electromagnetic radiations are of the following types: the so-called "Charge-Coupled Devices" (CCD), the so-called "Drift Chambers" or "Silicon Drift Detectors" (SDD), the so-called "Microstrip Detectors" and the so-called "Pixel Detectors".

CCDs essentially include a chip made of a semiconductor, typically silicon, in which a plurality of potential energy wells for the electrons located in one or more successions at predetermined distances are generated by a corresponding plurality of electrodes. The incident radiation generates electron-hole couples in the semiconductor. Holes are immediately collected by a suitable static biasing electric field generated in the semiconductor, while electrons are confined to the potential energy well which is closer to the point of incidence of the ionizing radiation. The potential energy wells are translated by timed signals along the semiconductor to one or more collector electrodes where the electrons generated by the incident radiation are collected and directed to an amplification chain.

The detection of the point of incidence of the ionizing radiation is accomplished in such apparatuses by counting the number of timed pulse signals needed to shift a determined potential well to the collector electrode. A bidimensional measurement of the point of incidence of the ionizing radiation can be made by providing a bidimensional arrangement of potential wells and a plurality of collector electrodes.

In radioastronomy, CCD apparatuses for X ray detection with high resolution in terms of energy due to the low output capacitance of the collector electrode have been developed. The resolution in the detection of the point of incidence depends on the mutual distance between the electrodes which generate the potential energy wells (dimension of the pixels).

The drawback of such apparatuses, however, is given by the need to generate such timing signals. The frequency of such signals can be limited by the need to have a sufficient translation efficiency during the movement of the potential energy wells, the time necessary for processing the signal associated to the electrons in each potential well arriving at the collector electrode, or the allowed power consumption. For example, in the spectroscopic measurements made in astronomy, the frequency of the timing signals is limited to about 100 kHz by the signal processing time. SDD detectors also include a chip made of a semiconductor, typically silicon, in which there are provided a succession of field electrodes (so-called "field strips") on both surfaces of the semiconductor chip and one or more electrodes for collecting the signal charges only on one surface. Said field strips which are biased by applying voltages that increase the magnitude with the distance from the collector electrodes, generate a static electric field (so-called electric drift field). The incident radiation generates electron-hole couples, the holes being immediately collected as for CCDs by the field strips which are closer to the source thereof (point of incidence), and the electrons drifting in parallel to the surfaces of the chip towards the collector electrodes to which the signal amplification chain is connected because of the electric drift field.

In such detectors the speed of translation of the electrons generated in the semiconductor towards the collector electrode may be greater than that in CCDs. Actually, such a speed is generally proportional to the applied electric drift field because of the lack of the above-mentioned typical limitations of CCDs concerning the charge transfer efficiency and the allowed consumption. Trials have shown, for example, that electric drift fields in the order of 200–1000 V/cm inducing drift speeds between 3 and 14 $\mu$m/ns can be applied.

A drawback of such a type of detectors consists in that a reference signal which is synchronous with the radiation arrival time should be generated in order to detect the point of incidence of the ionizing radiation. This further complicates the detector design and the acquisition electronics.

SUMMARY OF THE INVENTION

In view of the state of art described the present invention aims at providing an apparatus for detecting energy and point of incidence of an electromagnetic radiation or an ionizing particle (hereafter generally referred to as "ionizing event") which does not suffer from the drawbacks of the previously described known detectors.

According to the present invention such an aim is accomplished by an apparatus for detecting energy and point of incidence of an ionizing event comprising at least one semiconductor layer with a first type of conductivity, in which at least one first doped region with the first type of conductivity and a corresponding plurality of second doped regions with a second type of conductivity associated to said at least one first doped region are formed on a first surface of said layer, said at least first doped region and said corresponding plurality of second doped regions defining a respective drift path for charge carriers with the first type of conductivity, and at least one third doped region with the second type of conductivity is formed on a second surface of said layer, and means for biasing said second doped regions and said third doped region which is capable of reversely biasing the junctions between the second doped regions and the semiconductor layer and between the third doped region and the semiconductor layer so as to deplete the semiconductor layer, characterized in that said biasing means is capable of providing two different operating conditions of the detection apparatus, the first operating condition providing the formation of a plurality of potential energy wells for said charge carriers in the semiconductor layer at predetermined distances along said drift path from said first doped region, said wells being able to confine all of the charge carriers generated by an ionizing event essentially to the points of incidence of the ionizing event itself, the second operating condition providing the removal of said potential energy wells so as to cause the charge carriers to drift towards said at least one first doped region along said drift path and keeping the charge carriers confined in the directions which are perpendicular to the drift path.

The detection apparatus according to the present invention does not need any reference signal for detecting the point of incidence of the ionizing event. Actually, after the detector is switched from the first operating condition to the second operating condition, the point of incidence of the ionizing event can be determined by measuring the time interval from said switching to the arrival of the charge carriers. In addition, unlike in CCD detectors, no high-frequency timing signal is needed. The detection apparatus according to the invention is a device with essentially static electric fields like the known SDD detectors, with the difference that the electric fields in the detection apparatus according to the invention are different in either operating condition. In operation, the detection apparatus remains in its first operating condition (otherwise called "acquisition" or "integration") for any length of time (which is generally inversely proportional to the rate of the incoming ionizing events to be measured but long enough with respect to the reading time); charge carriers generated by an ionizing event are collected in the potential energy well which is the closest to the point of incidence of the radiation. The detection apparatus is then switched to the second operating condition (otherwise called "drift" or "readout" condition) in which the potential energy barriers that prevented the charge carriers from moving along the drift path are removed and the charge carriers can drift towards the collector electrode even though they are confined in the directions which are perpendicular to the drift path. The point of incidence of the radiation hitting the detection apparatus can be determined without any reference signal by measuring the time interval between the switching of the detection apparatus from the first to the second operating conditions and the incoming of the charge carriers.

Therefore, the detection apparatus according to the present invention, unlike the known SDD detectors, has two different operating modes: the integration mode and the readout mode; it is only in the latter mode that the detection apparatus generally operates as a conventional SDD detector in which, however, charge carriers are also confined to the other direction which is perpendicular to the drift path in addition to the direction perpendicular to the surface of the apparatus. The detection apparatus according to the invention can be referred to as a controlled-drift apparatus since the condition in which the charge carriers generated by the ionizing events can drift towards the collector electrode is not permanent. In fact it is established only during determined time intervals. In a similar way as in CCD detectors, charge carriers generated by the incident ionizing event are collected and confined to potential energy wells during the integration time. However, unlike CCD detectors in which the electric fields are dynamic during the readout time, the electric fields of the detection apparatus according to the invention are different but nevertheless static in either operating condition.

A number of geometries are possible. A detection apparatus with linear geometry has a plurality of collector electrodes generally aligned in a first direction on the first surface of the semiconductor, such a plurality of electrodes being associated to a plurality of second doped regions, and the drift paths of the charge carriers towards the corresponding collector electrodes are generally parallel to one another and perpendicular to said first direction. The collector electrodes of a detection apparatus with cylindrical geometry are located along a circumference, and the drift paths of the charge carriers towards the respective collector electrodes are the radii of said circumference. Another possible geometry is a spiral in which a collector electrode is provided, and the second doped regions associated thereto are located along a spiral. In this case, the drift path coincides with said spiral.

BRIEF DESCRIPTION OF THE DRAWINGS

These and other features of the present invention will be more readily apparent from the following detailed description of some preferred embodiments thereof which are shown by way of not limiting examples in the accompanying drawings, in which.

DETAILED DESCRIPTION OF A PREFERRED EMBODIMENT

Figure 1:
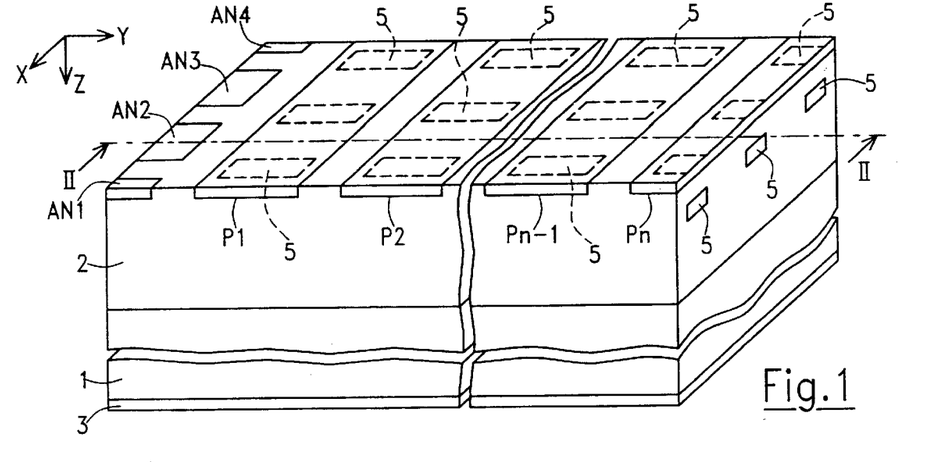
FIG. 1 shows an axonometric view of a detection apparatus according to a first embodiment of the present invention.

With reference to FIG. 1, an apparatus for detecting energy and point of incidence of an electromagnetic radiation or an ionizing particle according to a first embodiment of the present invention comprises a high-resistivity substrate 1 with a first type of conductivity above which a lower-resistivity epitaxial layer 2 still with the first type of conductivity is formed. In this example it is supposed that substrate 1 and epitaxial layer 2 are of the N type; however, they could also be of the P type. Substrate 1 has for example a thickness of about 300 $\mu$m and a resistivity of a few kOhm.cm, while epitaxial layer 2 has a thickness of about 20 $\mu$m and a resistivity of a few tens Ohm.Cm.

A continuous layer 3 with a second type of conductivity (therefore of the P type as far as the present example is concerned) which is opposite to the first type of conductivity is formed on the lower surface of substrate 1 (otherwise called back of the detector). The continuous layer 3 could also be replaced by a plurality of regions of the P type.

A plurality of N+ doped regions AN1–AN4 aligned with the X-axis of FIG. 1 and placed at regular intervals are formed on the upper surface of epitaxial layer 2 (otherwise called front of the detector). A succession of P+ doped strips P1–Pn which extend in the direction of the X-axis is formed along the Y-axis. A succession of buried doped regions 5 of the P type (dashed regions in FIG. 1) is formed under each P+ doped strip Pl–Pn.

Figure 2:
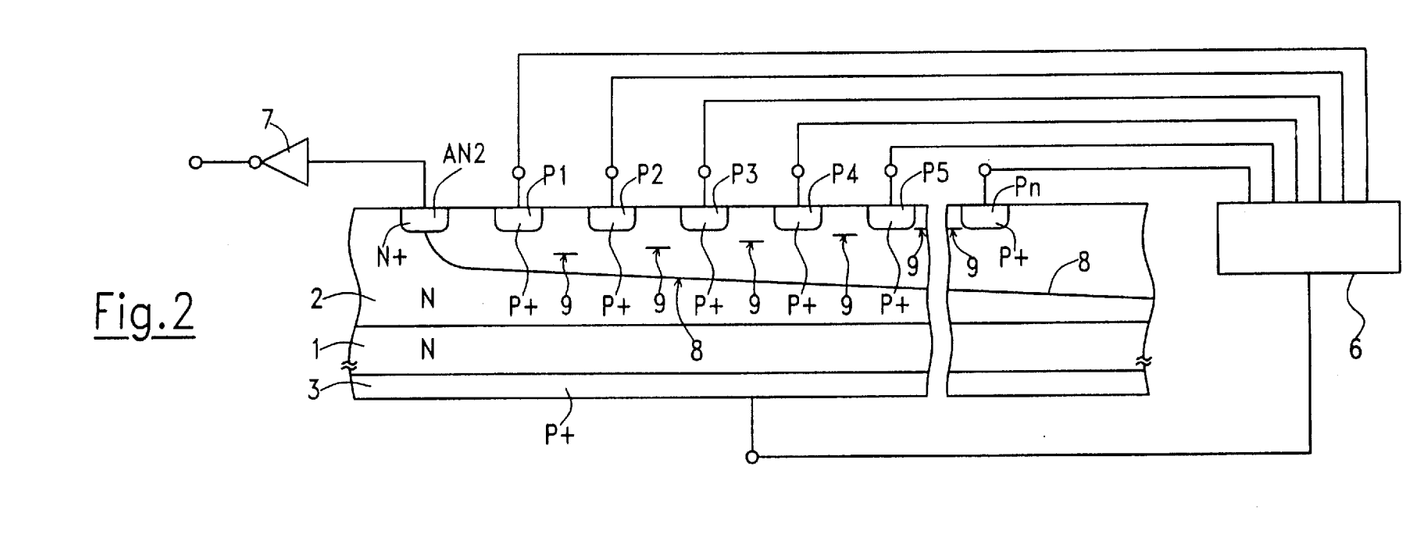
FIG. 2 shows a sectional view of said detection apparatus according to a vertical plane along line II—II of FIG. 1.

FIG. 2 shows a general sectional view of the detection apparatus of FIG. 1 along a vertical plane YZ extending between two buried doped regions 5 of the P type of FIG. 1, provided with biasing means 6 of P+ regions P1–Pn at the front part of the apparatus and of P+ layer 3 at the back of the same, and signal amplification means 7 connected to N+ region AN2. P+ layer 3 at the back of the apparatus, P+ regions P1–Pn at the front of the apparatus and N+ regions AN1–AN4 are biased so as to completely deplete substrate 1 and epitaxial layer 2 and generate under a first operating condition a plurality of potential energy wells 9 for the electrons, and under a second operating condition a path 8 (locus of the points with the potential energy minimum for the electrons along the Z axis while shifting along the Y-axis direction) which is generally but not exclusively included within epitaxial layer 2, and along such a path 8 the electrons which are confined to such wells 9 in the first operating condition, drift towards the collector electrodes formed by N+ regions AN1–AN4.

Figure 3:
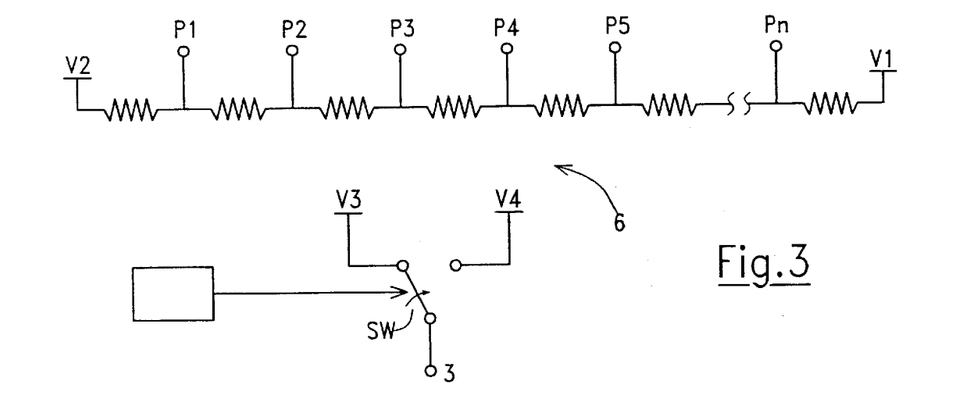
FIG. 3 shows schematically a biasing circuit for the detection apparatus of FIG. 2.
Figure 4:
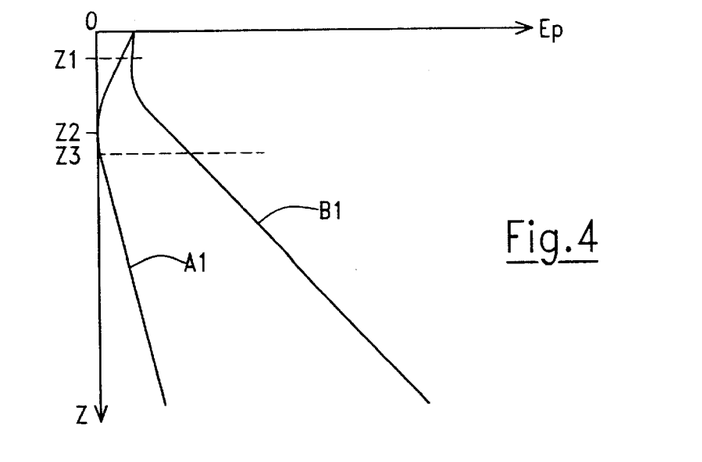
FIG. 4 is a diagram of the potential energy in the detection apparatus according to two different operating conditions corresponding to two different biasing conditions of the detection apparatus of FIG. 1 which can be obtained with the biasing circuit of FIG. 3.

Biasing means 6 schematically shown in FIG. 3 comprises a biasing circuit for P+ regions P1–Pn formed by a voltage divider which allows a plurality of intermediate voltages generally varying in a linear fashion to be obtained from two voltages V1, V2; for example, voltages V1, V2 and the resistances of the voltage divider can be selected so that region P1 is biased to −20V, region P2 to −21V, region P3 to −22V, and so on, up to region Pn biased to −100V. Biasing means 6 further comprises a switch SW capable of switching the bias voltage of P+ layer 3 at the back of the apparatus from a first voltage V3 ranging, for example, between −200V and −300V to a second voltage V4 ranging, for example, between −500V and −600V, and viceversa. In the first operating condition of the detection apparatus known as integration mode, P+ layer 3 is biased to voltage V4, while on switching the detection apparatus to a second operating condition, known as readout mode, the biasing voltage of P+ layer 3 is taken to V3. The bias of P+ regions P1–Pn remains unchanged in both operating conditions. FIG. 4 shows the diagram of potential energy of the electrons as a function of the distance from the front surface of epitaxial layer 2 and at a general distance from N+ collector anode AN2 along the Y-axis; in the figure, level Z3 corresponds to the interface between epitaxial layer 2 and substrate 1. Curve Al shows the potential energy of the electrons in the readout mode when P+ layer 3 is biased to voltage V3. Instead curve B1 shows the diagram of potential energy in the integration mode when P+ layer 3 is biased to voltage V4. It is possible to notice that the potential energy minimum is located at level Z2 in the first case and at level Z1 in the second case: in both cases, therefore, the potential energy minimum is within epitaxial layer 2, however, in the integration mode such a minimum is closer to the front surface of epitactic layer 2. The level at which the potential energy minimum is located corresponds to the level at which the electrons are confined in the first operating condition or integration mode, and to the level at which the electrons drift in the second operating condition or readout mode. Therefore, by varying the bias of P+ layer 3 even though the bias of P+ regions P1–Pn is kept unchanged, the level of the potential energy minimum of the electrons can be shifted along the Z-axis, thus switching between the two operating conditions.

Figure 5:
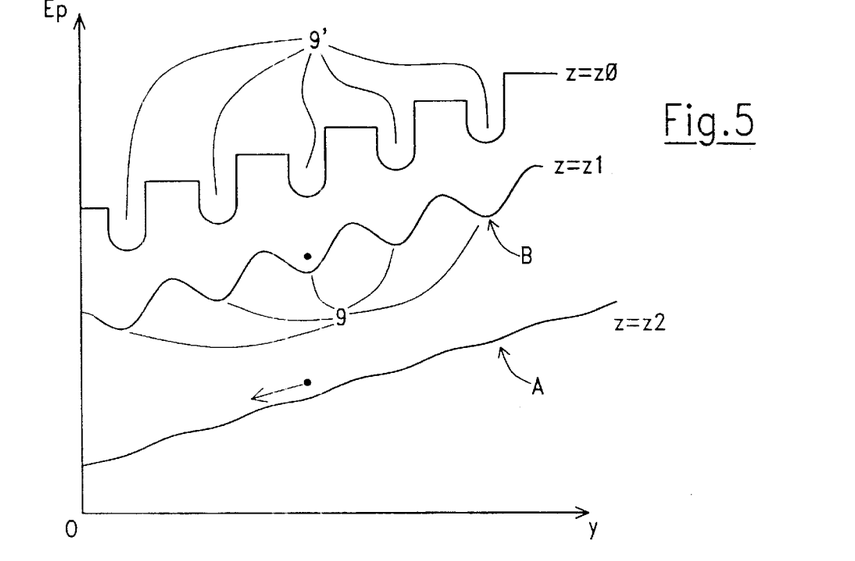
FIG. 5 is a diagram showing the potential energy in a so-called "drift channel", formed by line II—II in the apparatus of FIG. 1, at the surface of the detection apparatus (Z=0) and at two different distances from said surface (Z=Z1 and Z=Z2) corresponding to the potential energy minimum in the first and in the second operating conditions, respectively.

FIG. 5 is a diagram of potential energy of the electrons along the Y-axis direction at three different levels along the Z-axis regarding the sectional view of FIG. 2 which shows the operating principle of the detection apparatus according to the first embodiment of the present invention. It can be noticed that at level Z=Z0 (front surface of epitaxial layer 2) the bias of the P+ regions corresponding to the equipotential stretches of the curve yields a potential energy with a mean value that increases along the Y-axis. The stretches of the potential energy curve where there are no P+ regions join the equipotential stretches without solution of continuity, thus forming potential energy wells 9'. At level Z=Z1 (curve B), i.e. at the level corresponding to the potential energy minimum along the Z-axis when P+ layer 3 is biased to V4 (integration mode), the potential energy wells 9 are lessened with respect to wells 9' at the surface but in any case sufficient to provide barriers to the drift of the electrons towards collector anode AN2 that are able to confine the electrons generated by the ionizing event; at level Z=Z2 (curve A), i.e. at level corresponding to the potential energy minimum along the Z-axis when P+ layer 3 is biased to V3 (readout mode), the potential energy wells have essentially disappeared and the potential energy approximates to a straight line that causes a drift field (therefore a drift speed) which is generally constant so as to drag the electrons generated by the ionizing event towards the N+ collector anode AN2 where amplification means 7 amplifies the electronic signal. Therefore, keeping the same biasing of P+ regions P1–Pn at the front of the detection apparatus, the level of the potential energy minimum of the electrons can be modified by varying the bias of P+ layer 3 at the back of the apparatus so that the potential energy wells for the electrons along the drift channel can be formed or removed. As it can be appreciated, according to the first embodiment of the present invention the pitch of the potential energy wells 9 is equal to the pitch of P+ regions P1–Pn.

Figures 6, 7:
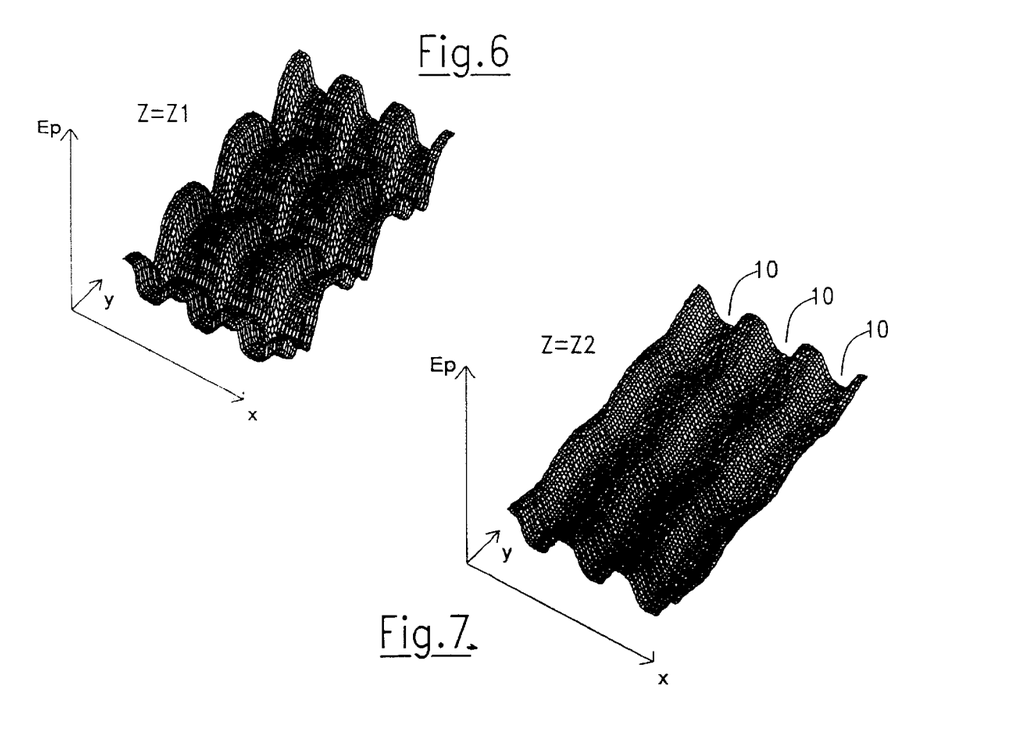
FIGS. 6 and 7 are tridimensional diagrams of the potential energy in the detection apparatus of FIG. 1 in said first and second operating conditions, respectively.

FIGS. 6 and 7 show the electron potential energy surfaces in the apparatus of FIG. 1 on the plane of the potential energy minimum Z=Z1 in the integration mode (P+ layer 3 biased to V4) and on the plane of the potential energy minimum Z=Z2 in the readout mode (P+ layer 3 biased to V3), respectively. In both operating modes it can be noticed that buried regions 5 of the P type form potential barriers which confine the electrons in the X-axis direction in order to make it possible to accomplish a complete confinement of the electrons in the integration mode and avoid a charge dispersion among several collector anodes in the readout mode. FIG. 7 shows "drift channels" 10 along which the electrons move to reach the respective collector anodes. FIG. 6 shows potential energy wells along the X-axis and Y-axis which confine the electrons generated by the ionizing event.

Figure 8:
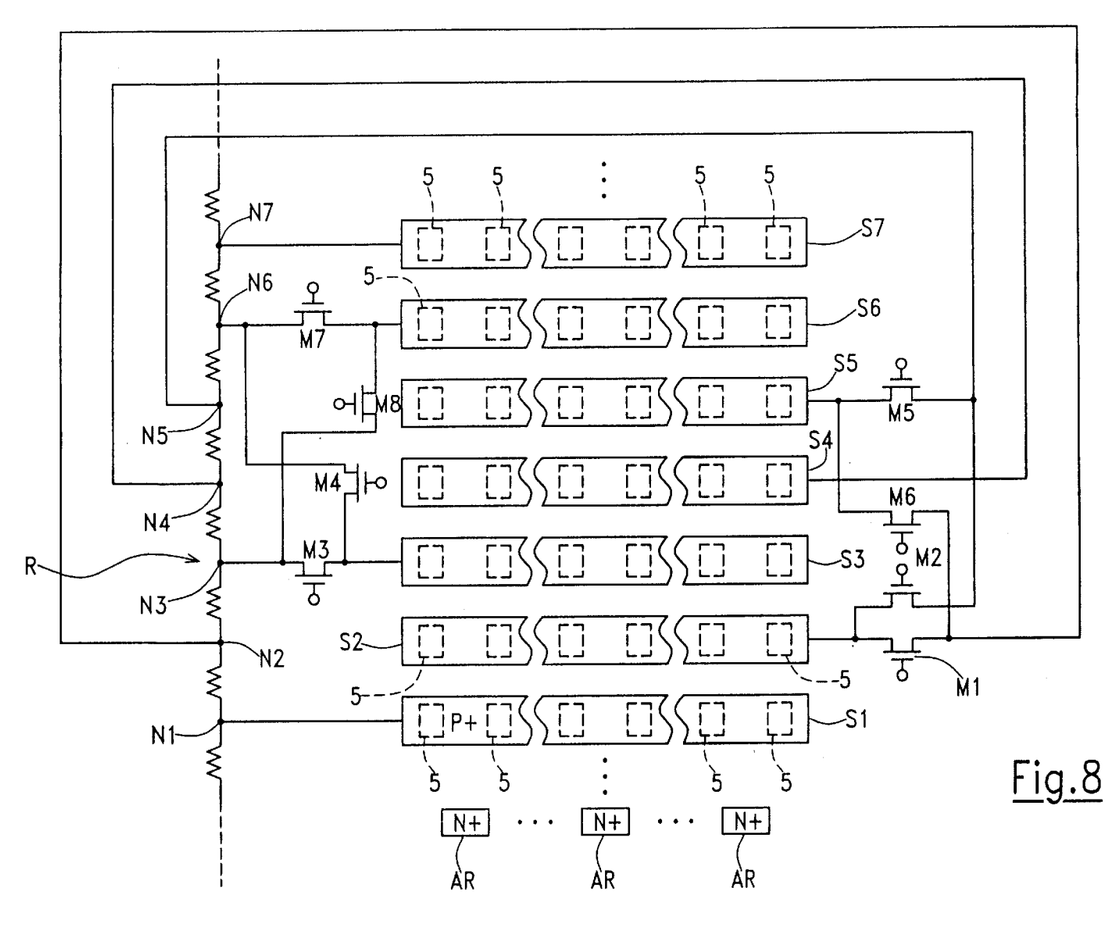
FIG. 8 shows a plan view of a detection apparatus according to a second embodiment of the present invention with a possible biasing circuit for said detection apparatus.

FIG. 8 shows a plan view of the front of a detection apparatus according to a second embodiment of the present invention. The back of such an apparatus, which is not shown in the figure, is formed by a continuous P+ layer like in the detection apparatus of FIG. 1 but could likewise be formed by a plurality of regions of the P+ type. In such second embodiment the potential energy wells for the electrons in the integration mode are obtained by varying the bias of P+ regions S1–S7 at the front of the apparatus with respect to the linear bias in the readout mode, while the bias of the continuous P+ layer at the back of the apparatus is kept constant in both operating conditions. Such a variation of the bias of P+ regions S1–S7 can consist, for example, of a sinusoidal modulation which is superimposed on the linear bias voltage.

Figure 9:
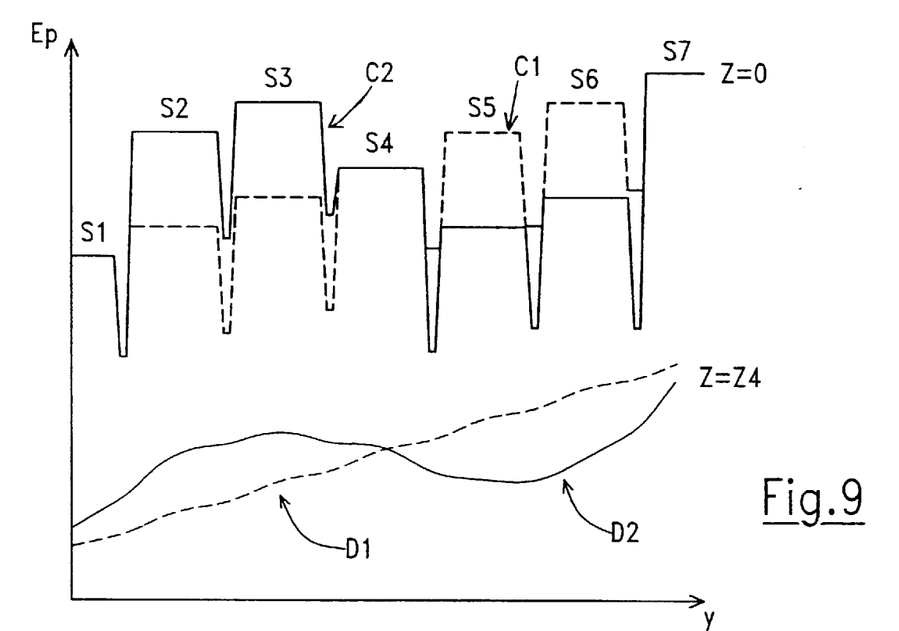
FIG. 9 is a diagram of the potential energy in both different operating conditions of the detection apparatus of FIG. 8 which can be obtained with the biasing circuit of FIG. 8 itself at the surface of the detection apparatus (Z=0) and at a distance from said surface (Z=Z4) corresponding to the potential energy minimum in the two operating conditions.

In FIG. 9, the dashed broken line C1 shows the potential energy of the electrons at level Z=0 (front of the detection apparatus) in the readout mode, i.e. when P+ regions S1–S7 of FIG. 8 are biased to gradually increasing negative potentials provided by a voltage divider like that shown in FIG. 8. The potential energy increases on the average along the Y-axis and has wells in the regions between two adjacent P+ regions. At level Z=Z4 corresponding to the potential energy minimum along the Z-axis a curve D1 is obtained, i.e. a potential energy which rises in a generally linear fashion (except for small ondulations) while shifting along the Y-axis. Solid line curve C2 shows potential energy variations at level Z=0 (front of the detection apparatus) in the integration mode, i.e. when a sinusoidal modulation is superimposed on the linearly increasing bias of P+ regions S1–S7 in the readout mode. In such particular example, the sinusoidal modulation period is as long as six times the pitch of P+ regions S1–S7. However, the sinusoidal modulation period could also be different according to the desired spatial resolution. The superimposition of the sinusoidal modulation on the linear bias yields curve D2 at potential energy minimum level Z=Z4. In such a second embodiment of the present invention the level of the potential energy minimum remains essentially unchanged in both operating conditions. As it can be seen, however, the superimposition of a sinusoidal modulation on the linear bias in the readout mode yields potential energy wells at the level Z=Z4 of the potential energy minimum having, in this example, a pitch which is as long as six times the pitch of P+ regions S1–S7 to which the electrons generated by the incident ionizing event are confined. When the sinusoidal modulation is taken off, the potential energy takes on the form of curve D1 again, i.e. generally rectilinear with small ondulations due to the potential energy wells at the interface between adjacent P+ regions, and the electrons can drift towards the respective collector anodes.

FIG. 8 also shows a possible embodiment of biasing means capable of providing the two biasing diagrams of the P+ surface regions in the readout and integration modes described above. The figure shows seven adjacent P+ surface regions S1–S7. There is provided a voltage divider R. P+ regions S1, S4 and S7 whose biasing voltage does not change when switching from readout to integration modes are directly connected in a fixed manner to nodes N1, N4 and N7 of divider R, respectively. P+ regions S2, S3, S5, S6 which must have different biasing voltages in the readout mode and in the integration mode may be connected to different nodes of the divider by switches formed, for example, by MOS transistors. For example, P+ region S2 is connected to node N2 of divider R by MOSFET M1 in the readout mode while in the integration mode it is connected to node N5 of divider R which is at a more negative potential than node N2 by MOSFET M2. Likewise, P+ region S3 is connected to node N3 of divider R by MOSFET M3 in the readout mode while in the integration mode it is connected to node N6 of divider R which is at a more negative potential than node N3 by MOSFET M4. P+ region S5 is connected to node N5 of divider R by MOSFET M5 in the readout mode while in the integration mode it is connected to node N2 which is at a more positive potential than node N5 by MOSFET M6. Likewise, P+ region S6 is connected to node N6 of divider R by MOSFET M7 in the readout mode while in the integration mode it is connected to node N3 which is at a more positive potential than node N6 by MOSFET M8. Therefore, in the readout mode each P+ region is connected to a respective node of the divider whose potential is even more negative on moving away from collector anode AR; thus, in the readout mode the linear biasing of P+ regions is guaranteed. In the integration mode, however, the bias of the P+ regions is modified as shown in FIG. 9 (curve C2). MOSFETs operating as switches can be integrated, as divider R can, in the same silicon chip of the detection apparatus. It is furthermore necessary to provide a suitable control circuit for the MOSFETs (not shown).

Another way for changing the bias of P+ regions S1–S7 at the front of the apparatus on switching from readout to integration modes is, for example, to provide more voltage dividers equal to one another instead of only one divider. P+ regions will be selectively connected to different dividers according to the voltage that they should reach in the integration mode.

In the readout mode all of the different dividers are biased to the same voltage, while in the integration mode the desired potential modulation can be obtained by varying the voltages applied to the ends of the single dividers. In the example shown in FIG. 8, P+ regions S1, S4 and S7 would be connected to a first divider which is the same as divider R shown, regions S2, S3 to a second divider, regions 5, S6 to a third one.

An advantage of such an embodiment consists in that the potential energy minimum of the electrons (therefore the drift channel and the acquisition wells) may be positioned far enough from the surface so as to make the surface effects negligible since deep enough potential energy wells may also be provided far from the surface of the front of the detection apparatus by varying the bias of the P+ regions at the front of the detection apparatus.

Figure 10:
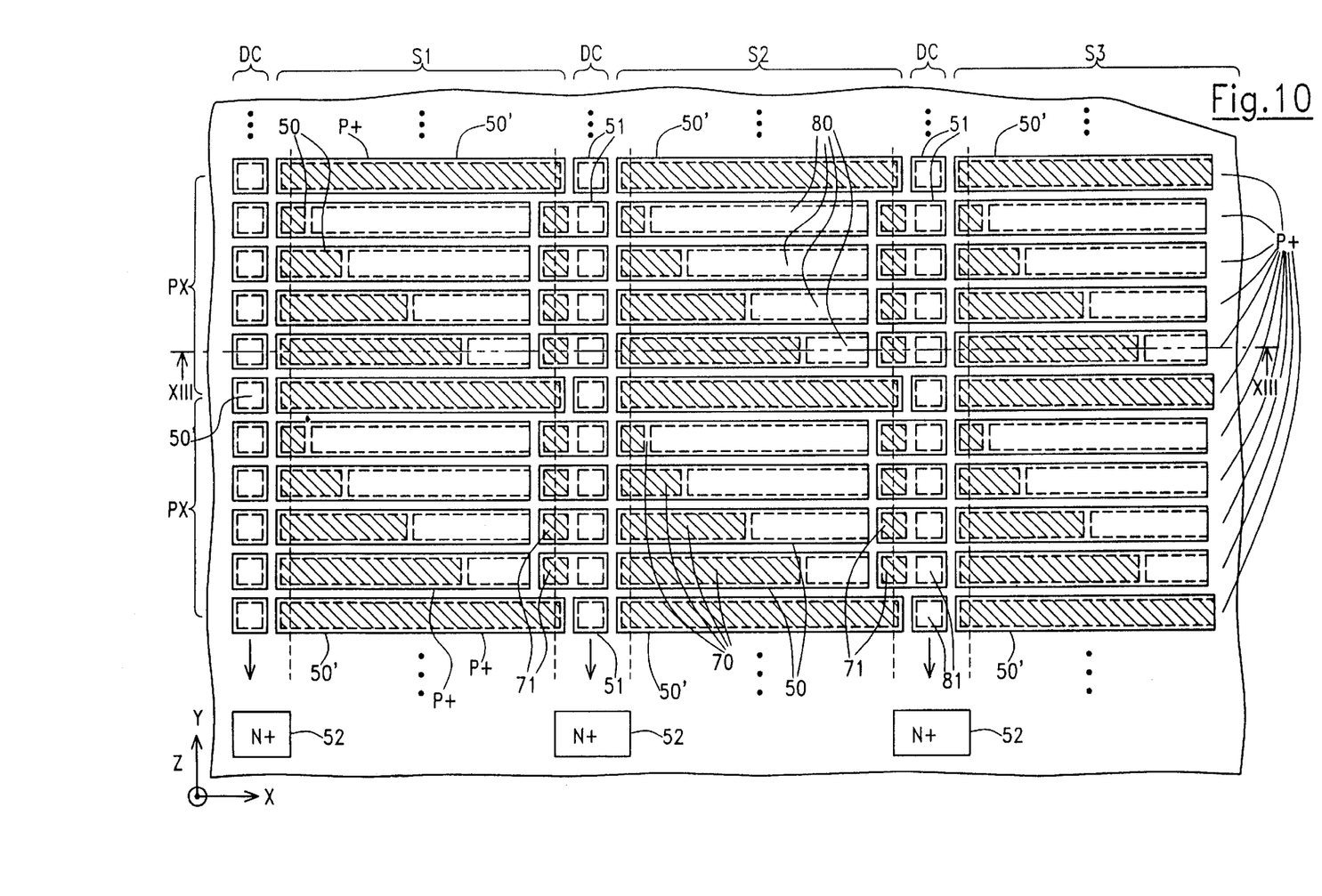
FIG. 10 schematically shows a plan view of a detection apparatus according to a third embodiment of the present invention.
Figure 13:
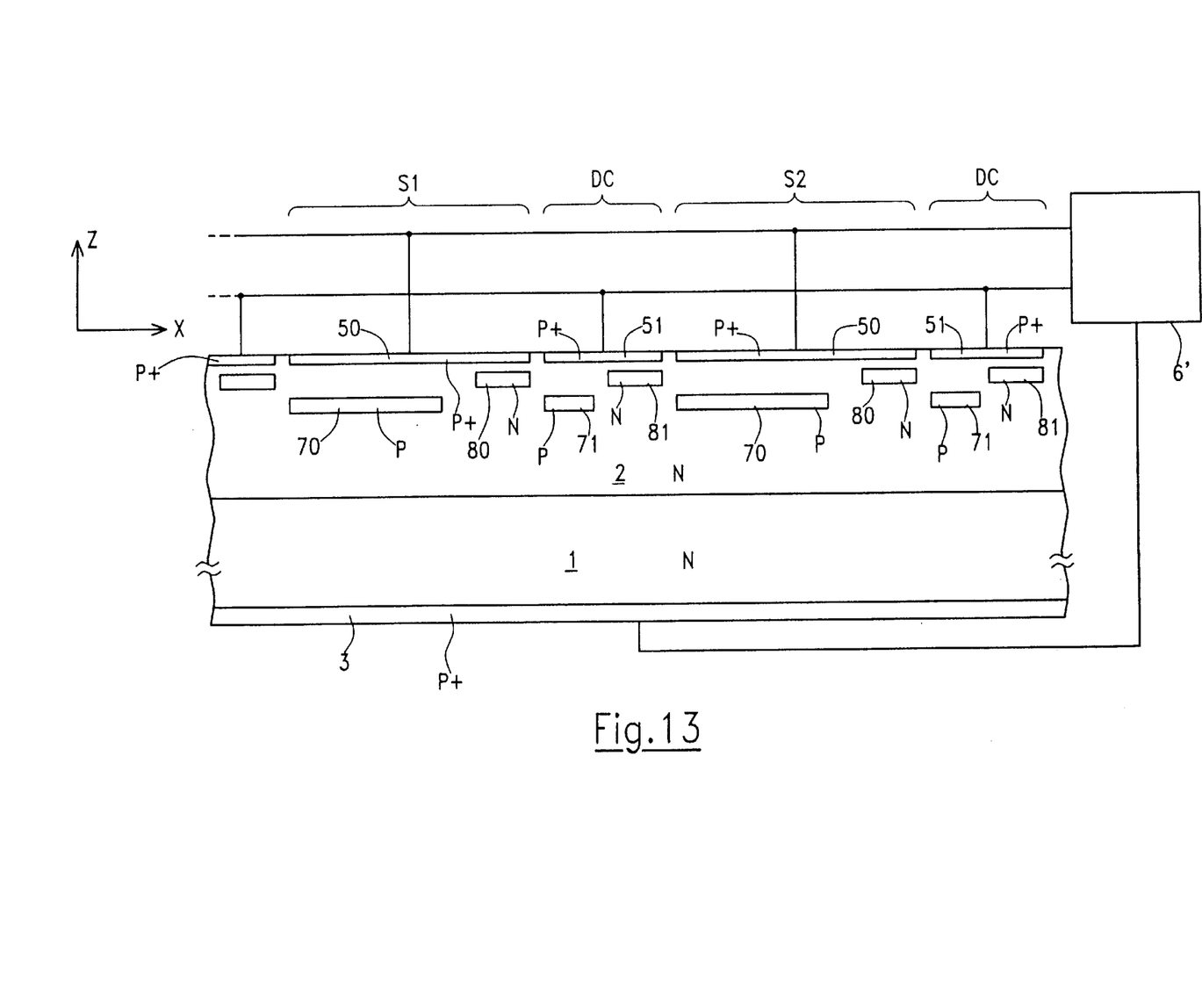
FIG. 13 is a sectional view according to plane XIII—XIII of FIG. 10.

FIG. 10 shows a top plan view of the front of the detection apparatus according to a third embodiment of the present invention. The back of the detection apparatus, not shown in the figure, is formed like in the detection apparatus of FIG. 1 by a continuous P+ layer but it could also be formed by a plurality of regions of the P+ type. A section of the detection apparatus along a vertical plane XZ according to the line XIII–XIII shown in FIG. 10 is shown in FIG. 13. Unlike the first and second embodiments of the present invention in which the potential energy wells for the electron confinement are present only in the integration mode and the "drift channels" for electron transport are present only in the readout mode (for example according to what described with reference to FIG. 1–7 or 8 and 9), in this third embodiment the regions of the apparatus to which the electrons are confined (potential energy wells) and the regions of the apparatus along which the electrons drift towards the respective collector anodes ("drift channels") are provided in the integration mode at the same time in different zones of the detection apparatus which are separated from each other by a potential energy barrier. During the readout mode such a potential energy barrier is removed, the electrons are quickly transferred from the potential energy wells to the corresponding drift channels along which the electrons drift towards the respective collector anodes. Such a potential energy barrier can be restored at the end of the readout mode (coinciding with the start of a new integration time) or at the end of the electron transfer.

More specifically, with reference to FIGS. 10 and 13 there is shown a possible implementation of the third embodiment of the present invention. In FIG. 10 three arrays or vectors S1–S3 of P+ doped regions 50, 50' are shown, each array being side by side to and separated from the adjacent array by a respective region acting as a drift channel DC for the electrons. In each array of P+ regions 50, 50' P+ regions 50 are divided in groups, each of them together with a P+ region 50' forming a pixel PX of the detection apparatus. Therefore, a bidimensional matrix of pixels is formed. Suitable biasing means 6' which is schematically shown allows P+ regions 50, 50', 51 to be biased. The dashed regions within P+ regions 50, 50' and 51 schematically indicate regions of the apparatus in which deep implants of the P type 70 and 71 are formed. The regions surrounded by dashed lines within P+ regions 50, 51 schematically indicate regions of the apparatus in which deep implants of the N type 80, 81 are formed.

The deep implant of the P type made at P+ regions 50' with a length greater than that of P+ regions 50 forms a potential energy barrier for the electrons. The structure of deep implants of the P type 70 and the N type 80 made at P+ regions 50 is such as to provide a potential energy capable of confining the electrons within the pixel where they were generated by the incident ionizing event as close as possible to the corresponding drift channel DC so as to optimize the next transfer.

Due to such a structure, a potential energy well for the electrons can be formed at the points of the apparatus corresponding to each pixel.

The regions in which drift channels DC for the electrons are formed consist of vectors of P+ regions 51, each placed side by side to a respective P+ region 50 or 50' forming the pixels. In a number of P+ regions forming the drift channels there are respective deep implants 71 of the P type which form a potential energy barrier that prevents the electrons in the potential energy wells at pixels PX from moving to the adjacent drift channel. In the remaining P+ regions 51 there are deep implants 81 of the N type.

In the integration mode, P+ regions 50, 50' forming pixels PX, and adjacent P+ regions 51 forming the drift channels are biased to the same potential which becomes even more negative (like in the preceding embodiments) while moving away from collector anodes 52. In these conditions, deep implants P and N cause potential energy wells for the electrons to be formed so as to confine the electrons into pixels PX and prevent them from flowing to the adjacent drift channel. When it is decided that the integration time is over and the readout time is started, P+ regions 51 forming the drift channels are biased to potentials which are more positive than those biasing adjacent P+ pixel regions 50. Thus, the potential barriers which separate pixels PX from the drift channels are removed and the electrons in the potential energy wells at pixels PX can flow to the respective drift channels and move towards the respective collector anodes (in the drawing the drift channel associated to each vector of pixels S1–S3 is located close to the right of the latter as the deep implants of the P type to the left of P+ regions 50 still form a generally unchanged potential energy barrier which prevents the electrons from migrating to the drift channel to the left of each vector of pixels PX).

Figure 11:
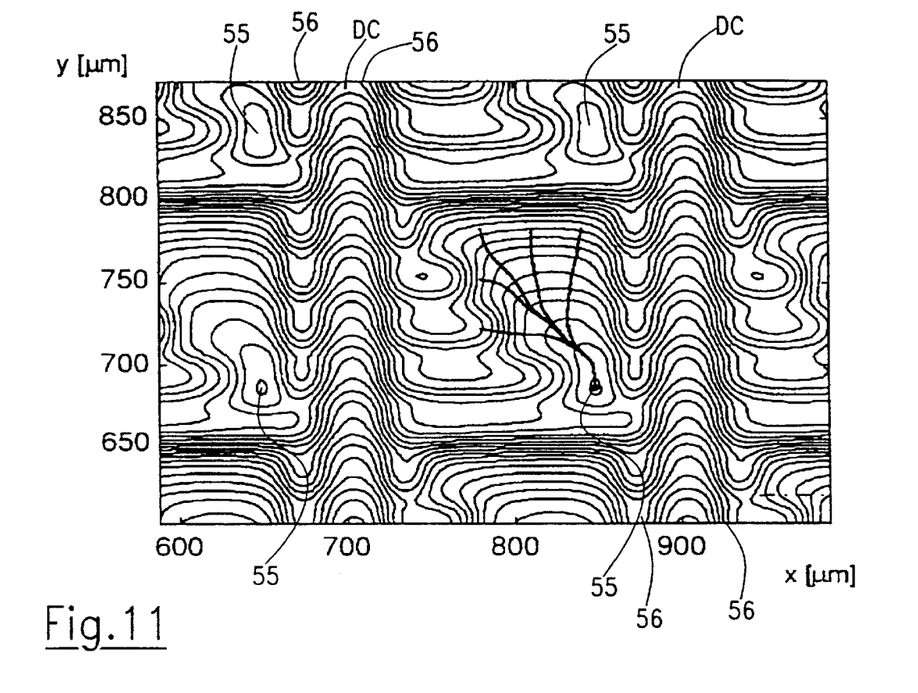
FIGS. 11 and 12 are diagrams showing the equipotential curves at the potential energy minimum (Z-axis) for the detection apparatus of FIG. 10 in the two operating conditions, respectively, the paths of the charge carriers being illustrated by way of example.

FIG. 11 shows the equipotential lines on a plane XY lying at a depth corresponding to the potential energy minimum along the axis which is perpendicular to the plane of the drawing in FIG. 10 in the integration mode. Potential energy wells 55 corresponding to each pixel PX, drift channels DC along the Y-axis direction, and potential barriers 56 at the side of the drift channels which separate potential energy wells 55 from drift channels DC are shown. The figure also shows by way of example the paths of the electrons relative to five different points of interaction of the ionizing event showing that the electrons are confined to the potential energy wells 55 within each pixel.

Figure 12:
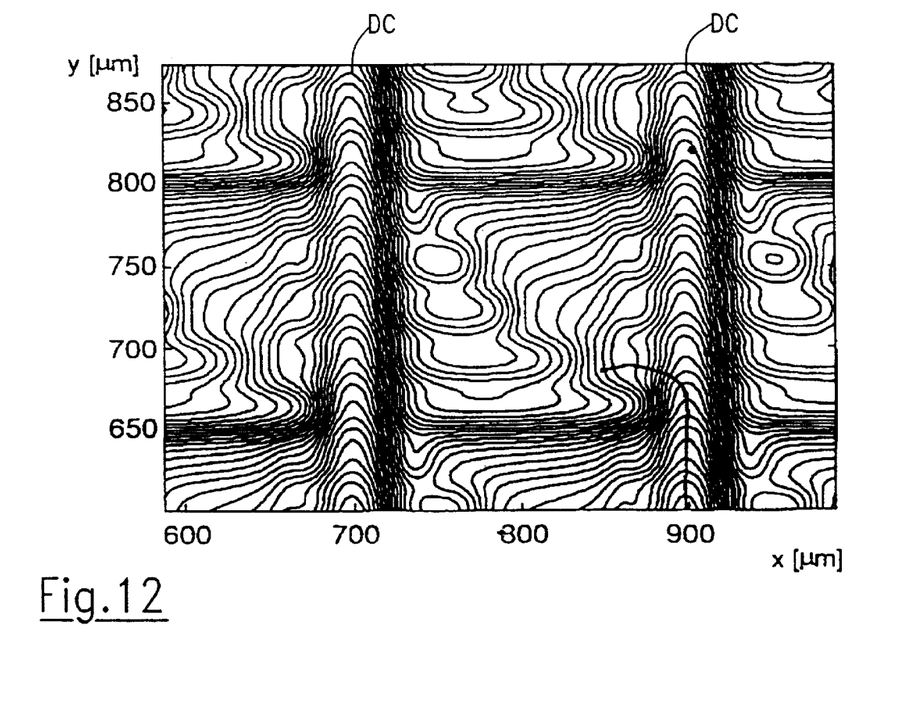

FIG. 12 shows the equipotential lines on the same XY plane of FIG. 11, in the readout mode. Potential energy wells 55 have disappeared and in their place there is a potential gradient able to transfer the electrons which were confined to potential energy wells 55 during the preceding integration mode to the adjacent drift channel DC. The figure also shows the path followed by the electrons during their transfer from the potential energy well to the adjacent drift channel DC.

The three embodiments described are only some implementation examples of the invention and should not be considered as limiting. Further embodiments are then possible without departing from the scope of the present invention as set forth in the appended claims. For example, although all of the three embodiments described relate to a detection apparatus with linear geometry in which all of the charge carrier drift directions towards the respective collector anodes are parallel to one another, a detection apparatus with different geometries can also be accomplished. A possible alternative geometry is cylindrical so that the collector anodes are located in succession along a circumference, and the charge carrier drift directions towards the respective collector anodes are the radii of said circumference. Another possible geometry is spiral-shaped.

What is claimed is:

1. An apparatus for detecting energy, time and point of incidence of ionizing particles, the apparatus comprising;
    A) a semiconductor layer with a first type of conductivity having a first surface and a second surface, said semiconductor layer containing majority carriers;
    B) at least one collecting electrode, each collecting electrode formed by doping with the first type of conductivity a region on the first surface of the semiconductor layer;
    C) a plurality of front strips formed by doping with a second type of conductivity regions on the first surface of the semiconductor layer thereby forming junctions between the front strips and the semiconductor layer;
    D) at least one back strip formed by doping with a second type of conductivity a region on the second surface of the semiconductor layer thereby forming at least one junction between said at least one back strip and the semiconductor layer;
    E) a plurality of doped layers buried at a distance from said first surface that range up to substantially 1% of the thickness of said semiconductor layer and electrically isolated from said first surface;
    F) means for biasing said front strips and said at least one back strip for reversely biasing the junction between the front strips and the semiconductor layer and between said at least one back strip and the semiconductor layer so as to deplete the semiconductor layer, said biasing means.

2. The apparatus according to claim 1 wherein said front strips, said at least one back strip and said at least one collecting electrode are biased in such a way to fully deplete the basic semiconductor layer of the majority carriers and to generate a potential minimum for the majority carriers along the depth of the basic semiconductor layer.

3. The apparatus according to claim 2 wherein the means for generating said potential energy wells comprises a pattern of doped regions with the first and/or second type of conductivity below at least a portion of said first surface.

4. The apparatus according to claim 3 wherein said potential wells are equally spaced.

5. The apparatus according to claim 3 wherein said biasing means
    i) generates a permanent and periodic potential perturbation along the direction of said drift path superposed to a monotonically varying potential able to create potential wells for the majority carriers within a given thickness of the basic semiconductor layer close to said first surface; and ii) defines the depth of the potential minimum for the majority carriers according to the operating conditions of the detection apparatus; during the first operating condition said potential minimum being placed within said given thickness, during the second operating condition said potential minimum being placed deeper in the semiconductor layer, where said permanent and periodic perturbation is substantially eliminated and the majority carriers are drifted to said at least one collecting electrode by the electrostatic field produced by the monotonically varying potential.

6. The apparatus according to claim 5 wherein said plurality of front strips define gaps between each front strip and wherein the dimensions and the bias voltage of the front strips and of the gaps generate potential wells for the majority carriers underneath said gaps between the front strips and generate said electrostatic field that drifts the majority carriers to said at least one collecting electrode.

7. The apparatus according to claim 6 wherein the depth of the potential minimum for the majority carriers is set by the bias voltage of said at least one back strip.

8. The apparatus according to claim 7 wherein the front strips are equally spaced along the direction of said drift path and are biased by a voltage divider at fixed potentials varying monotonically along said drift path.

9. The apparatus according to claim 3 wherein said biasing means define two different potential profiles at said first surface, one for each operating condition: during the first operating condition, the potential at said first surface varies along said drift path in a non-monotone fashion in order to create, at a given depth into said basic semiconductor layer, potential wells for the majority carriers whose minima are at monotonically varying potentials along said drift path, and during the second operating condition the potential at said first surface varies monotonically along said drift path in order to produce an electrostatic field that carries the majority carriers to said at least one collecting electrode at approximately said given depth.

10. The apparatus according to claim 9 wherein said potential profiles at said first surface are defined by biasing the front strips at different voltages according to the operating conditions: during the first operating condition said voltages vary along said drift path in a non-monotone fashion, in order to determine a potential profile at said first surface equal to a periodical potential perturbation superposed to a monotonically varying potential, and during the second operating condition said voltages vary monotonically along said drift path.

11. The apparatus according to claim 10 wherein said periodical potential perturbation has a period corresponding to a predetermined number of said front strips.

12. The apparatus according to claim 11 wherein said front strips are equally spaced along the direction of said drift path.

13. The apparatus according to claim 12 wherein said biasing of the front strips comprises a plurality of voltage dividers, each said front strip being connected to a respective intermediate node of a respective voltage divider.

14. The apparatus according to claim 12 wherein said biasing of the front strips comprises a one voltage divider and a switching means for selectively connecting each said front strip to different nodes of said voltage divider according to the operating conditions.

15. The apparatus according to claim 3 wherein said biasing means:
i) combined with said doped layers, divides the first surface into at least a first area, such that an array of potential wells for the majority carriers, whose minima are at monotonically varying potentials along the direction of said drift path, are generated in the underlying semiconductor volume, and at least a second area adjacent to said array of potential wells, henceforth called drift channel, wherein the majority carriers are moved along said drift path to one collecting electrode; and
ii) transfers the majority carriers from said first area to said drift channel at the beginning of the second operating condition.

16. The apparatus according to claim 15 wherein the potential of the first area and of the underlying semiconductor volume is defined by a first set of front strips biased at monotonically varying potentials along the direction of said drift path, and by a suitable pattern of doped regions with the first and second type of conductivity buried underneath said first area.

17. The apparatus according to claim 16 wherein the potential of the second area and of the underlying semiconductor volume is defined by a second set of front strips biased at monotonically varying potentials along the direction of said drift path and by a suitable pattern of doped regions with the first and second type of conductivity buried underneath said second area.

18. The apparatus according to claim 17 wherein the front strips of the first and second sets are equally spaced along said drift path and are biased by two different voltage dividers.

19. The apparatus according to claim 18 wherein the transfer of the majority carriers, from said array of potential wells to said drift channel, is achieved by changing the voltage applied to each front strip of the first set with respect to the corresponding front strip of the second set.

20. The apparatus according to claim 1 further comprising:
a) means for generating a first set of voltages applied to said front strips and said at least one back strip that, combined with said doped layers, produce a first static potential distribution in the volume of said semiconductor layer with at least the following characteristics: (i) one or more arrays of potential wells are formed at given distances from said first surface greater than about 1% of the thickness of said semiconductor layer, (ii) the minima of said potential wells are at monotonically varying potential the further away a particular potential well is from said collecting electrode, and (iii) potential barriers of given amplitude are set for each of said potential wells;
b) means for generating a second set of voltages applied to said front strips and said at least one back strip that, combined with said doped layers, produce a second static potential distribution in the volume of said semiconductor element such that: (i) one or more drift channels are formed at given distances from said first surface greater than about 1% of the thickness of said semiconductor layer, (ii) each said drift channel defines the trajectory of motion of the majority carriers parallel to said first surface and the confinement of the majority carriers in the directions perpendicular to said trajectory, and (iii) a static electric field is created that moves the majority carriers along said drift channels towards said at least one output electrode; and
c) means for switching from said first set of voltages to said second set of voltages and vice versa with given transition times.

21. The apparatus according to claim 20 further comprising means for generating a reference signal synchronous with the start of the movement of the majority carrier that can be used to measure the transit time of the majority carriers.

* * * * *

UNITED STATES PATENT AND TRADEMARK OFFICE
CERTIFICATE OF CORRECTION

PATENT NO.      : 6,249,033                                               Page 1 of 1
DATED           : June 19, 2001
INVENTOR(S)     : Andrea Castoldi et al.

It is certified that error appears in the above-identified patent and that said Letters Patent is hereby corrected as shown below:

<u>Claim 1,</u>
Line 44, the word "junction" should be replaced with the word -- junctions --
Lines 47-48, the phrase "layer, said biasing means" should be replaced with -- layer --

Signed and Sealed this

Second Day of April, 2002

*Attest:*

JAMES E. ROGAN
*Attesting Officer*           *Director of the United States Patent and Trademark Office*